United States Patent [19]

Hobson

[11] Patent Number: 4,951,242

[45] Date of Patent: Aug. 21, 1990

[54] MEDIAN FILTERS HAVING MODULES FOR RECEIVING THE CURRENT VALUE OF AN INCOMING DIGITAL SIGNAL

[75] Inventor: Neville Hobson, Essex, United Kingdom

[73] Assignee: GEC Avionics Limited, Kent, United Kingdom

[21] Appl. No.: 402,970

[22] Filed: Sep. 5, 1989

Related U.S. Application Data

[63] Continuation of Ser. No. 87,037, Aug. 10, 1987, abandoned.

[30] Foreign Application Priority Data

Aug. 20, 1986 [GB] United Kingdom ............... 8620278

[51] Int. Cl.$^5$ .............................................. G06F 7/00
[52] U.S. Cl. .............................................. 364/715.01
[58] Field of Search ....................... 364/715.01, 724.01

[56] References Cited

U.S. PATENT DOCUMENTS 4,135,248  1/1979  Bluzer .................................. 364/575
4,513,440  4/1985  Delman .......................... 364/715 X
4,713,786  12/1987  Roskind ............................. 364/715

FOREIGN PATENT DOCUMENTS 2129172  5/1984  United Kingdom .

Primary Examiner—Gary V. Harkcom
Assistant Examiner—Tan V. Mai
Attorney, Agent, or Firm—Lowe, Price, LeBlanc, Becker & Shur

[57] ABSTRACT

A median filter includes a number of identical modules each arranged simultaneously to receive the current value of an imcoming digital signal. Each module includes a feedback shift register of special design enabling it to be set to receive its input to any one of its stages. The shift registers of the different modules are set to receive their inputs at different stages and logic means is associated with each shift register for comparing the content of one stage with the contents of each other stage to determine whether the content of that said one stage is the medium value. If it is the median value it is passed to an output of the circuit.

2 Claims, 2 Drawing Sheets

MEDIAN FILTERS HAVING MODULES FOR RECEIVING THE CURRENT VALUE OF AN INCOMING DIGITAL SIGNAL

This is a continuation of Ser. No. 087,037, filed Aug. 10, 1987, now abandoned.

BACKGROUND OF THE INVENTION

This invention relates to a median filter which is a device which receives an input signal representing a sequence of input values and produces an output signal representing a series of output values each of which is the median of an associated group of input values.

The invention arose when considering the design of a median filter for processing video signals in which each of the aforementioned input values represents the intensity of an associated pixel and in which these values appear at a very high rate. The design of a median filter for this purpose, using known techniques such as that described in our co-pending application Ser. No. 8229599 is relatively complex leading to the need for substantial capital investment in the initial design work and in preparations for manufacture e.g. using integrated circuit techniques.

SUMMARY OF THE INVENTION

This invention provides a median filter comprising a number of identical modules each arranged simultaneously to receive the current value of an incoming digital signal, each module comprising feedback shift register which can be set to receive its input at any one of its stages, means for setting the shift registers of the different modules to receive their inputs at different stages, logic means associated with each shift register for comparing the contents of one stage with the content of each other stage to determine whether the content of that said one stage is the median value, and means for passing it to an output in response to such a detection.

Each of the aforementioned "modules" can be relatively simple compared with a conventional median filter and can accordingly be accommodated on a single integrated circuit of a sufficiently small size to be economical to design and to tool up for manufacture. Furthermore, the number of input values in each "group" from which the median is selected is determined only by the number of modules. Thus, different filters having different characteristics can be made in accordance with the invention simply by including different numbers of modules in them. Alternatively a standard filter having a large number of modules (possibly included in a single integrated circuit) can be adapted to be set so as to make use of just some of the modules as required. It would be possible to make a provision to change the number of modules used and therefore the characteristics of the filter automatically in response, for example, to the amount of background noise detected in the input signal.

The means for setting the feedback shift register can conveniently be provided by a number of selectors, one associated with each stage of the shift register, for optionally feeding to that stage the content of a previous stage or the input signal, and means for setting the selectors so that the input signal is passed to a chosen one of the stages and so that each of the other stages receives the output from the previous stage.

One way in which the invention may be performed will now be described by way of example with reference to the accompanying drawings in which:

DESCRIPTION OF THE PREFERRED EMBODIMENT

The illustrated filter is for filtering a video signal in digital form to remove high frequency components characteristic of background detail.

Figure 1:
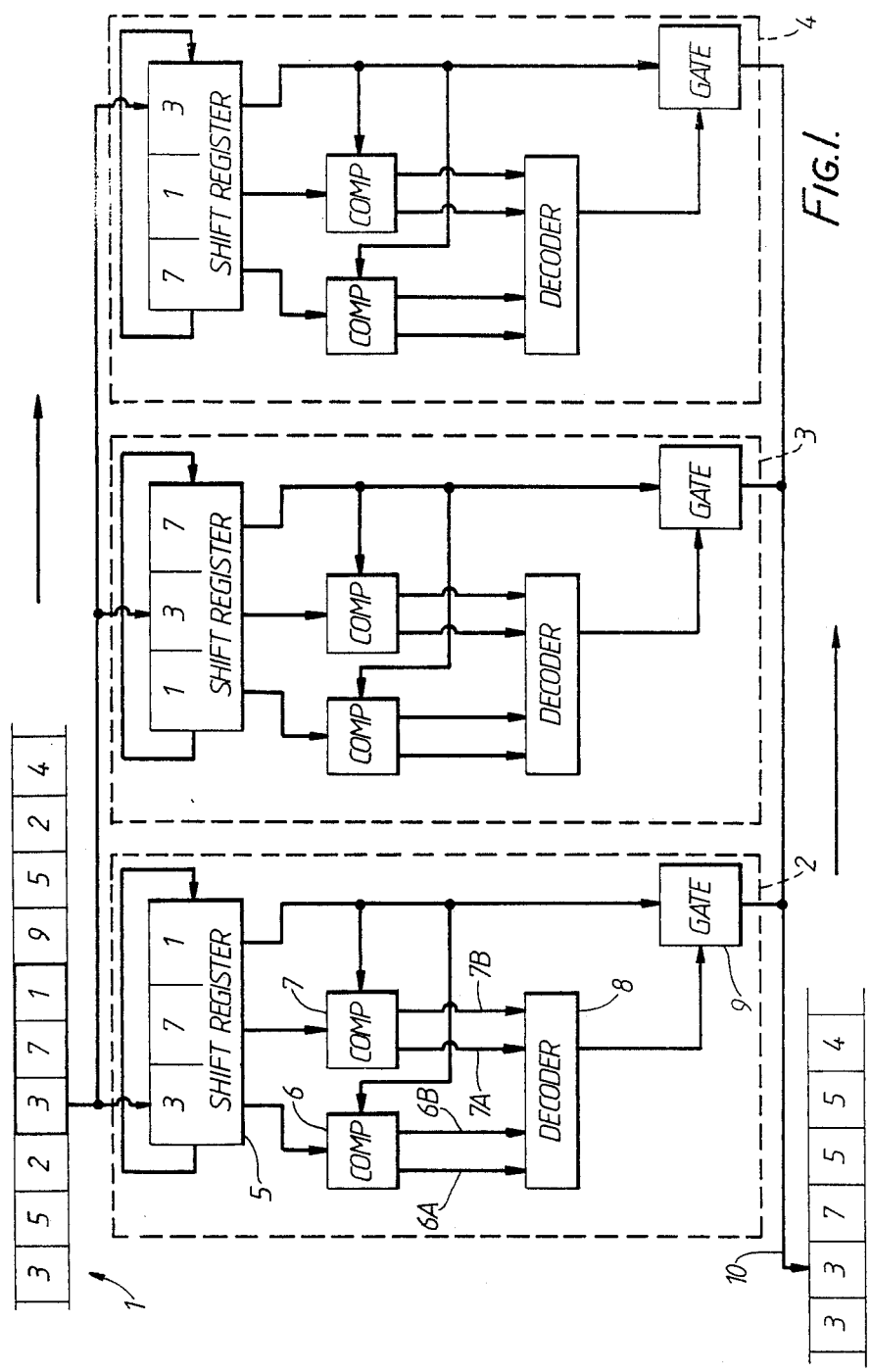
FIG. 1 is a schematic block diagram of a median filter constructed in accordance with the invention.

Referring firstly to FIG. 1 the series of numbers shown at 1 represents 10 successive examples of the incoming signal 4259173253 in that order. These are applied to the inputs of three modules 2,3 and 4. In the module 2 the input signal is applied to the first cell of a three stage feedback shift register 5 so that, after entering any three successive numbers, such as the numbers 1,7,3, the first number appears in the third stage, the second number appears in the second stage and the third number appears in the first stage.

The outputs of the first and second stages are applied to logic circuits 6 and 7. Circuit 6 compares the contents of the first and third stages of the shift register and produces a logic signal 1 on line 6A if the latter is greater than the former, and the logic signal 1 on line 6B if they are the same. The circuit 7 compares the contents of the second and third stages and produces a logic signal 1 on line 7A if the latter is greater than the former and a logic signal 1 on line 7B if they are the same. The outputs 6A, 6B, 7A, 7B form a code having 16 possible values, three of which are indicative of the content of the third stage being the median. The decoder 8 responds to the presence of any one of these three values by enabling the gate 9 to pass the content of the third stage to the filter output 10.

The module 3 is identical to the module 2 except that the input signal is applied to the second stage of the shift register of module 3. Consequently the first number of the sequence shown at 1 appears in the first stage, the second number of the sequence appears in the third stage and the third number of the sequence appears in the second stage.

The module 4 is also identical to the module 2 except that the input signal is applied to the third stage of the shift register. Consequently the first number of the sequence is applied to the second stage, the second number of the sequence is applied to the first stage and the third number of the sequence is applied to the third stage.

From the foregoing it will be apparent that the first, second and third numbers of the sequence are applied to the gatos 9 of the three modules but only that which represents the median is passed to the output 10.

Figure 2:
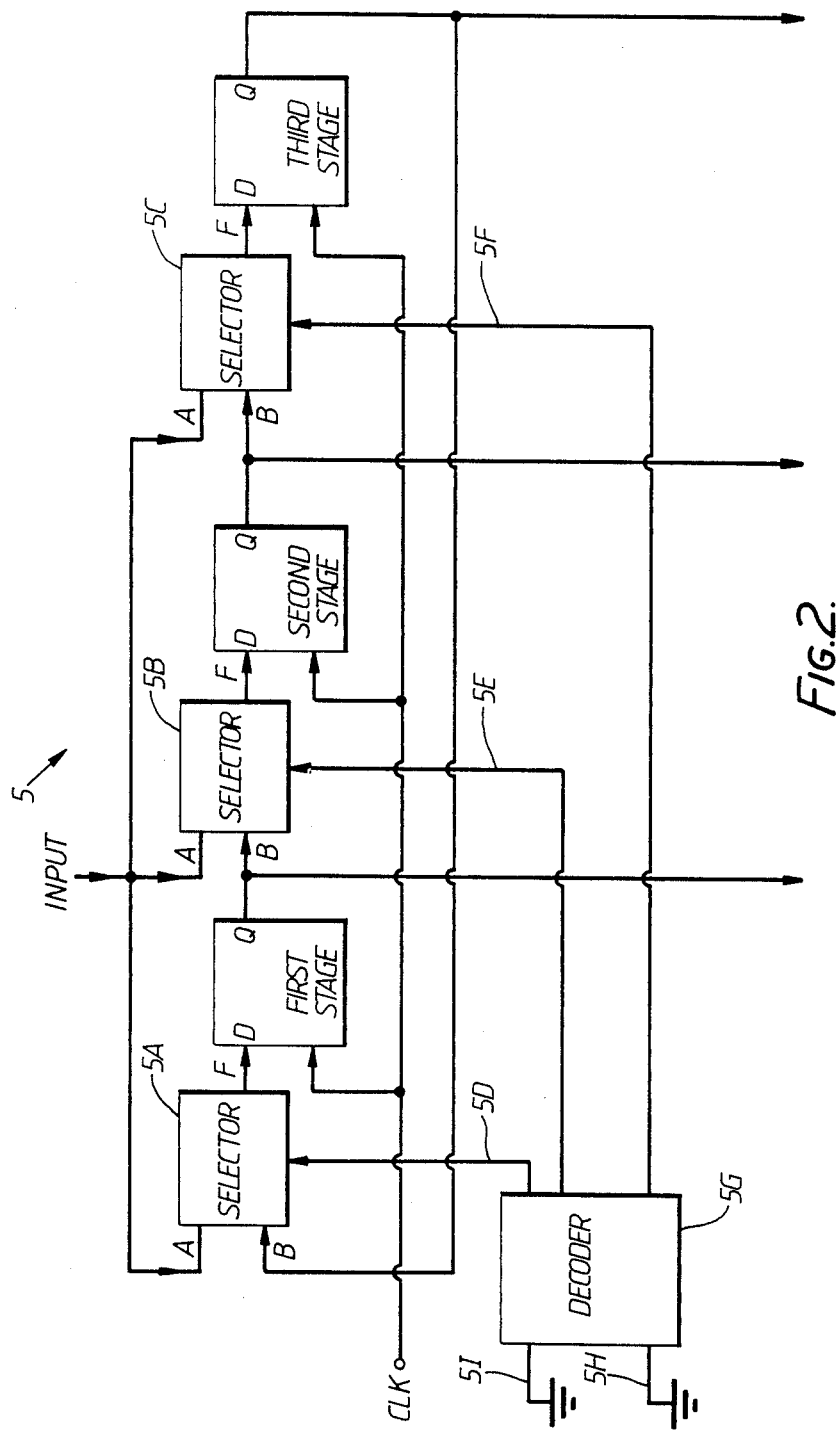
FIG. 2 is a more detailed diagram of one of the shift registers indicated generally by the reference numeral 5 on FIG. 1.

The shift registers are of a special design which enables them to be identical but to be set so as to accept their inputs at different stages. The shift register 5 of module 2 will now be described with reference to FIG. 2.

The input to shift register 5 is applied to the inputs labelled "A" of 3 selectors 5A, 5B and 5C. These are controlled by binary Control signals on lines 5D, 5E and 5F generated by a one of three decoder 5G. The latter is programmed externally by fixing the potentials on its two inputs 5H and 5I. In the case of decoder 5G its two inputs are set at values 0. This produces codes on lines 5D, 5E and 5F such as to select input "A" of 5A and input "B" of 5B and 5C.

The inputs corresponding to 5H and 5I of the shift registers in module 3 are set such as to cause the equivalent of 5B to select input "A" and the equivalent of 5A and 5C to select input "B".

The inputs corresponding to 5H and 5I of the shift registers in module 4 are set such as to cause the equivalent of 5C to select input "A" and the equivalent of 5A and 5B to select input "B".

The components 5A, 5B, 5C and 5G thus constitute means for setting the shift register to receive its input at a particular chosen stage.

It will be appreciated that the illustrated filter is designed to calculate tho median of groups of 3 input values. A group of 3 has been selected for simplicity of description and it will be appreciated that larger groups containing any odd number M of input values could be processed in an analogous fashion providing the shift registers have a similar number M of stages and provided there are a similar number M of modules available for use. Where the shift registers have a larger number of stages than is required for a particular filtering purpose each selector 5A, 5B and 5C can be constructed and controlled so as to feed to its associated shift register stage either the input signal or a chosen output from any of the other stages; or no signal at all. In this way the effective size of the shift registers can be controlled as can the number of modules operative at a given time.

I claim:

1. A median filter comprising a plurality of identical modules each arranged to simultaneously receive the current value of an incoming digital signal, each module comprising a feedback shift register which is capable of being set to receive an input signal at any one of its stage, means for setting the feedback shift register of each module to receive an input signal at a stage different than that of the other shift registers, means for comparing the content of one stage of each of said feedback shift registers with the content of each other stage of said feedback shift register to determine whether the content of said stage is the median value, and for passing the content of said one stage to the output in response to such detection of said median value.

2. A median filter according to claim 1 wherein said means for setting each of said feedback shift registers comprises a selector for each stage of said shift register for feeding to said stage the content of a previous stage of the input signal and means for setting the selector so that said input signal is passed through a chosen one of the stages so that each of the other stages receivers the output from the previous stage.

* * * * *